United States Patent
Sakurai et al.

[11] Patent Number: 6,140,019
[45] Date of Patent: Oct. 31, 2000

[54] RADIATION SENSITIVE COMPOSITION

[75] Inventors: Kouichi Sakurai; Hiroaki Nemoto; Atsushi Kumano, all of Yokkaichi, Japan

[73] Assignee: JSR Corporation, Tokyo, Japan

[21] Appl. No.: 09/120,883

[22] Filed: Jul. 23, 1998

[30] Foreign Application Priority Data

| Jul. 24, 1997 | [JP] | Japan | 9-212711 |
| Aug. 26, 1997 | [JP] | Japan | 9-243568 |
| Aug. 27, 1997 | [JP] | Japan | 9-244854 |
| Sep. 25, 1997 | [JP] | Japan | 9-276630 |

[51] Int. Cl.$^7$ .............................. G03F 7/027; G02B 5/22
[52] U.S. Cl. ................................ 430/288.1; 430/285.1; 430/284.1; 430/143; 430/176; 430/188; 430/190; 430/192; 430/195; 430/196
[58] Field of Search ............................. 430/288.1, 285.1, 430/284.1, 143, 176, 188, 190, 192, 195, 196; 522/75

[56] References Cited

U.S. PATENT DOCUMENTS

| 4,934,791 | 6/1990 | Shimizu et al. | 350/317 |
| 5,095,379 | 3/1992 | Fuknaga et al. | 359/68 |
| 5,240,797 | 8/1993 | Matsushima et al. | 430/7 |
| 5,362,603 | 11/1994 | Katoh et al. | 430/281.1 |
| 5,498,498 | 3/1996 | Uchikawa et al. | 430/7 |

FOREIGN PATENT DOCUMENTS

| 0 320 264 | 6/1989 | European Pat. Off. . |
| 0 340 968 | 11/1989 | European Pat. Off. . |
| 0 359 934 | 3/1990 | European Pat. Off. . |
| 0 371 398 | 6/1990 | European Pat. Off. . |
| 0 531 106 | 3/1993 | European Pat. Off. . |
| 0 539 606 | 5/1993 | European Pat. Off. . |
| 0 548 870 | 6/1993 | European Pat. Off. . |
| 0 726 279 | 8/1996 | European Pat. Off. . |
| 2 586 488 | 2/1987 | France . |
| 38 42 507 | 6/1989 | Germany . |
| 8-211220 | 8/1996 | Japan . |
| 8-259876 | 10/1996 | Japan . |
| 9-15857 | 1/1997 | Japan . |
| 9-68608 | 3/1997 | Japan . |
| 10-31308 | 2/1998 | Japan . |
| 1513149 | 6/1978 | United Kingdom . |

OTHER PUBLICATIONS

Registry No. 980–26–7 in Registry File on STN Database, copyright 1999, ACS, online, 2 pages.
Kobayashi et al, Derweet—ACC–No. 1989–174539, English Abstract of Japanese Patent Document JP 01152449A issued Jun. 14, 1989, 3 pages.
Registry No. 1047–16–1, in Registry File of STN Database, Copyright 1999, ACS, 2 pages.
Patent Abstracts of Japan, vol. 11, No. 298 (P–620), Sep. 26, 1987, JP 62 089905, Apr. 24, 1987.
Patent Abstracts of Japan, vol. 12, No. 170 (P–705), May 20, 1988, JP 62 280807, Dec. 5, 1987.
Patent Abstracts of Japan, vol. 11, No. 234 (P–628), Oct. 22, 1987, JP 62 108204, May 19, 1987.
Patent Abstracts of Japan, vol. 10, No. 180 (P–471), Jun. 24, 1986, JP 61 027506, Feb. 7, 1986.
Patent Abstracts of Japan, vol. 11, No. 298 (P–620), Sep. 26, 1987, JP 62 089905, Apr. 24, 1987.

*Primary Examiner*—Cynthia Hamilton
*Attorney, Agent, or Firm*—Oblon, Spivak, McClelland, Maier & Neustadt, P.C.

[57] ABSTRACT

A radiation sensitive composition comprising (A) a colorant containing a quinacridone pigment, a mixture of an isoindolinone pigment and a yellow organic pigment or a mixture of copper phthalocyanine blue and a green pigment, (B) an alkali-soluble resin, (C) a polyfunctional monomer and (D) a photopolymerization initiator. The composition is useful for production of an additive or subtractive color filter which is used in a reflection-type color liquid crystal display device.

10 Claims, 9 Drawing Sheets

6,140,019

RADIATION SENSITIVE COMPOSITION

DETAILED DESCRIPTION OF THE INVENTION

The present invention relates to a radiation sensitive composition containing a specific pigment. More specifically, it relates to a radiation sensitive composition which can be advantageously used for the production of an additive or subtractive color filter to be used in a reflection-type color liquid crystal display device.

In color filters used in a color liquid crystal display device, two or more different color pixels are arranged in parallel to one another or across one another to form a striped pixel pattern, or in both horizontal and transverse directions to form a square pixel pattern on the surface of a transparent substrate such as glass. The pixel is as minuscule as several tens to several hundreds of micrometers.

To produce a color filter having such minuscule pixels arranged regularly, there have been employed a dying method in which a coating film formed by coating a photosensitive resin on a substrate is exposed to radiation through a photomask to cure exposed portions and developed, and after unexposed portions are removed to form a pattern, the pattern is dyed; a photolithography method in which a coating film is formed using a composition comprising a photosensitive resin and a colorant (dye or pigment) dispersed or dispersed therein, exposed and developed in the same manner as in the dying method to form a pattern; and the like.

In a color liquid crystal display device, a transparent electrode made from indium oxide, tin oxide or the like is formed on a color filter by vapor deposition or sputtering and an alignment layer for aligning liquid crystals in a fixed direction is further formed on the transparent electrode so as to drive the liquid crystals. To obtain a high-performance transparent electrode and alignment layer, a high temperature of 200° C. or higher, preferably 250° C. or higher is required when these are formed.

Of color filters manufactured by the above methods, a color filter produced by using a dye has high transparency to radiation but is insufficient in terms of heat resistance. Therefore, this method has a problem in that the formation of a transparent electrode and an alignment layer must be carried out at a temperature lower than 200° C., thereby making it impossible to ensure sufficient performance for the transparent electrode and alignment layer. A color filter produced by using a dye is also inferior in light resistance and hence not suitable for outdoor use.

Then, a pigment has recently been used in place of a dye, and most of color filters currently manufactured comprise an organic pigment.

Color liquid crystal display devices are roughly divided into transmission-type color liquid crystal display devices which display images with transmission light from a backlight installed at the back of the device and reflection-type color liquid crystal display devices which display images by reflecting incident light coming from the front of the device with a reflector such as an aluminum foil provided on the reverse of a transparent substrate installed at the back of the device. The reflection-type color liquid crystal display devices have been widely used because they have such an advantage that another separate light source is not required and power consumption is low.

Color filters to be used in color liquid crystal display devices are available in additive color filters having three primary colors—red (R), green (G) and blue (B)—and subtractive color filters having three colors complementary to the primary colors—cyan (C), magenta (M) and yellow (Y).

JP-A 9-68608 (the term "JP-A" as used herein means an "unexamined published Japanese patent application") discloses that a color filter having excellent heat resistance and light resistance and color purity equal to or higher than that of a color filter produced by the dyeing method can be formed by using a specific azo metal salt pigment or a mixture of the pigment and a yellow pigment as a colorant for a coloring composition for use in a reflection-type color liquid crystal display device.

However, since the relationship between the spectral transmittance of the colorant used and the spectrum of surrounding light (such as sunlight and fluorescent light) is not taken into consideration in this coloring composition and the coloring composition is inferior in white balance, the composition is still unsatisfactory as a coloring composition used for the formation of a color filter for a reflection-type color liquid crystal display device.

Therefore, the development of an additive color filter to be used in a reflection-type color liquid crystal display device which has heat resistance, light resistance and spectral transmittance optimized based on the spectrum of surrounding light as well as a subtractive color filter to be used in a reflection-type color liquid crystal display device which has heat resistance, light resistance and excellent white balance has been strongly desired.

It is therefore an object of the present invention to provide a radiation sensitive composition containing a specific pigment.

It is another object of the present invention to provide a radiation sensitive composition which is advantageously used for the production of an additive and/or subtractive color filter having excellent heat resistance and light resistance and spectral transmittance optimized to suit the spectrum of surrounding light.

It is still another object of the present invention to provide a radiation sensitive composition which is advantageously used for the production of a subtractive color filter having excellent heat resistance, light resistance and white balance.

It is still another object of the present invention to provide a radiation sensitive composition which is advantageously used for the production of the above color filters to be used in a reflection color liquid crystal display.

Other objects and advantages of the present invention will become apparent from the following description.

According to the present invention, firstly, the above objects and advantages of the present invention can be attained by a radiation sensitive composition (may be referred to as "the first radiation sensitive composition of the present invention" hereinafter) comprising:

(A1) a colorant containing a quinacridone pigment represented by the following formula (1):

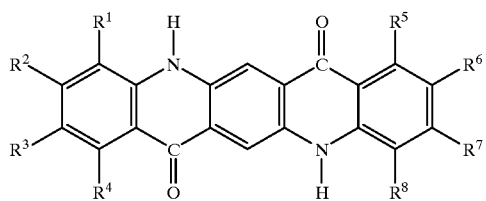

(1)

wherein $R^1$ to $R^8$ are independently a hydrogen atom, a methyl group or a chlorine atom;
(B) an alkali-soluble resin;
(C) a polyfunctional monomer; and
(D) a photopolymerization initiator.

Secondly, the above objects and advantages of the present invention can be attained by a radiation sensitive composition (may be referred to as "the second radiation sensitive composition of the present invention" hereinafter) comprising:

(A2) a colorant containing a mixture of an isoindolinone pigment represented by the following formula (2) and a yellow organic pigment;

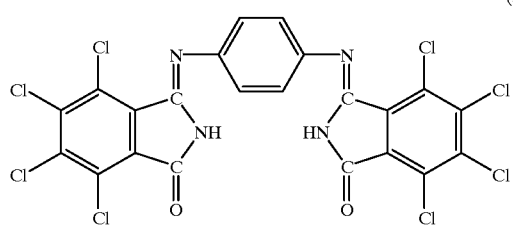

(2)

(B) an alkali-soluble resin;
(C) a polyfunctional monomer; and
(D) a photopolymerization initiator.

Thirdly, the above objects and advantages of the present invention can be attained by a radiation sensitive composition (may be referred to as "the third radiation sensitive composition of the present invention" hereinafter) comprising:

(A3) a colorant containing copper phthalocyanine blue represented by the following formula (3):

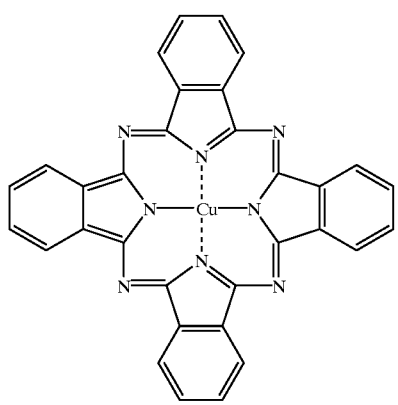

(3)

and at least either one of a green pigment represented by the following formula (4):

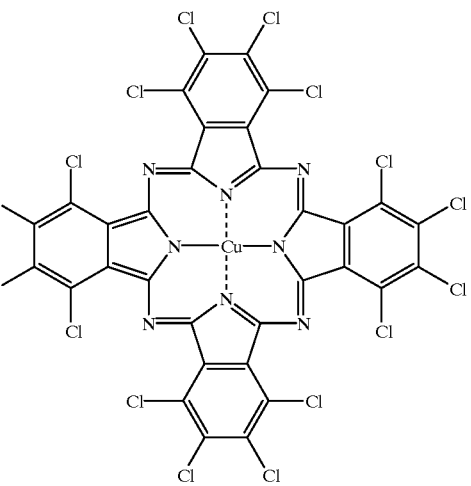

(4)

and a green pigment represented by the following formula (5):

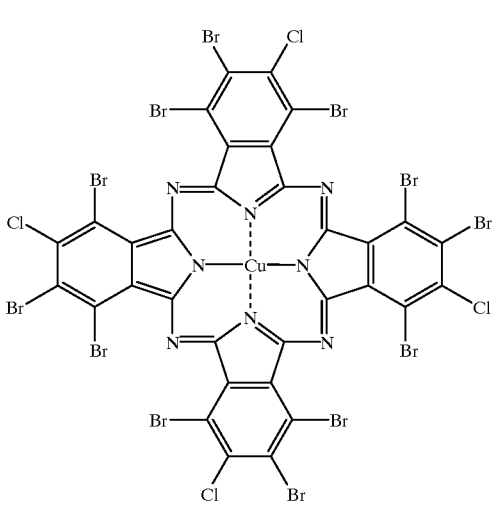

(5)

in an amount of 50 wt % or less, based on the total weight of the copper phthalocyanine blue and the green pigments;
(B) an alkali-soluble resin;
(C) a polyfunctional monomer; and
(D) a photopolymerization initiator.

The term "radiation" as used in the present invention includes visible light, ultraviolet light, far ultraviolet light, X-ray, electron beam and the like.

Figure 1:
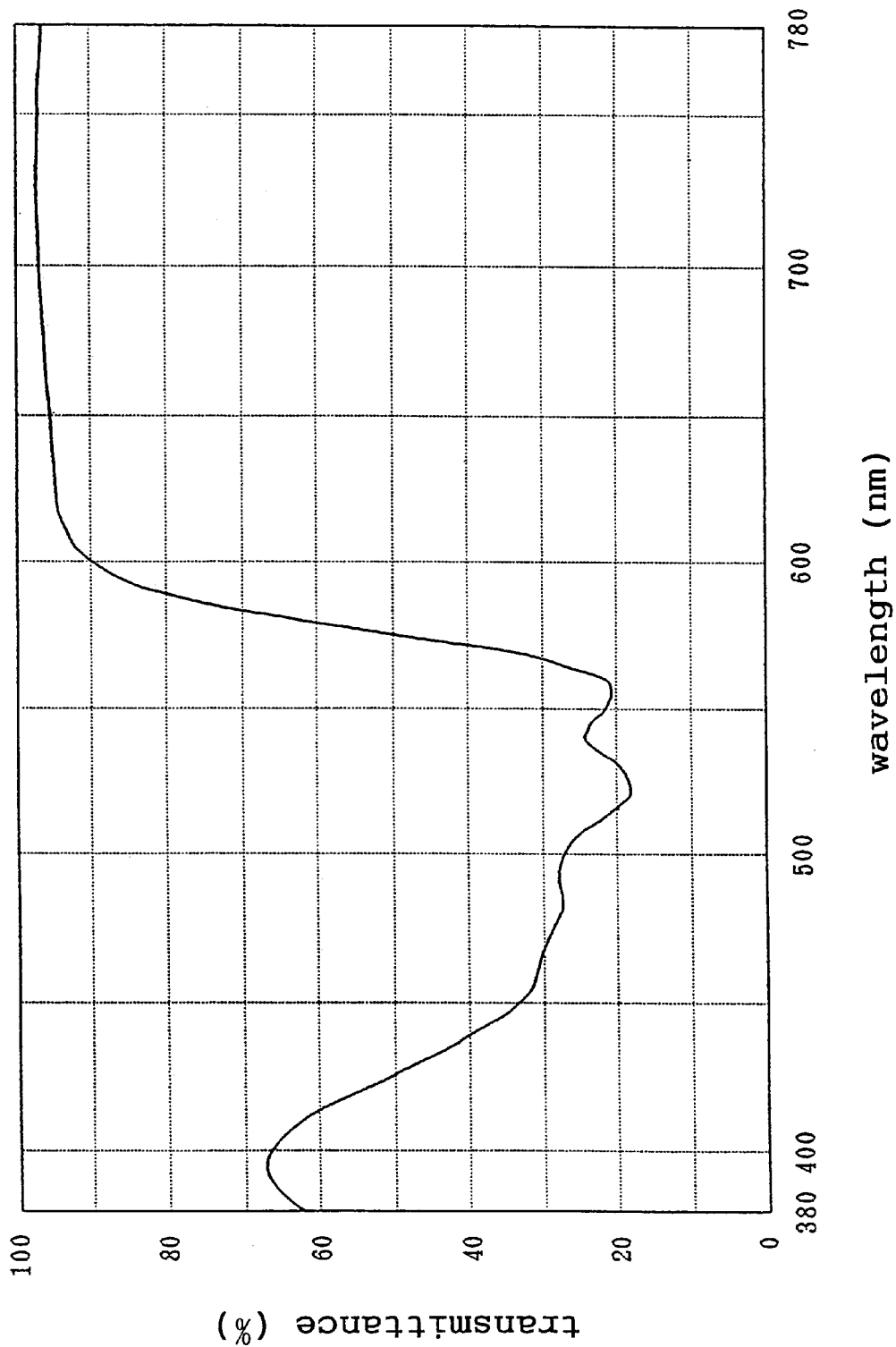
FIG. 1 shows the measurement result of the spectral transmittance of a color filter produced using the radiation sensitive composition (composition 1) of the present invention.

The present invention will be described in detail below.

(A) Colorant

The first, second and third radiation sensitive compositions of the present invention contain a colorant comprising a quinacridone pigment of the above formula (1), a mixture of an isoindolinone pigment of the above formula (2) and other yellow pigment, and a mixture of the copper phthalocyanine blue of the above formula (3) and at least either one of the green pigment of the above formula (4) and the green pigment of the above formula (5), respectively.

Illustrative examples of the quinacridone pigment (to be referred to as "quinacridone pigment (1)" hereinafter) are indicated by the following Color Index (C.I.; issued by The Society of Dyers and Colourists) numbers and component names (within the parentheses): C.I. Pigment Violet 19 (quinacridone), C.I. Pigment Red 122 (2,9-dimethylquinacridone), C.I. Pigment Red 202 (2,9-dichloroquinacridone), C.I. Pigment Red 206 (solid solution of quinacridone and 6,13-dioxoquinacridone), C.I. Pigment Red 207 (solid solution of quinacridone and 4,11-dichloroquinacridone) and C.I. Pigment Red 209 (3,10-dichloroquinacridone). The quinacridone is available in α-, β- (violet) and γ- (red) type crystal forms. Particularly preferred as the quinacridone pigment (1) in the present invention is γ-type quinacridone.

The first radiation sensitive composition can contain other pigment in combination with the quinacridone pigment (1) as a colorant component in an amount not impairing the desired effect of the present invention.

Although the above other pigment can be suitably selected according to the application of a color filter and the desired color of a pixel, an orange pigment is preferred because the hue of the pixel can be easily controlled with the orange pigment.

Illustrative examples of the above orange pigment include those represented by such color index (C.I.) numbers as C.I. Pigment Orange 36, C.I. Pigment Orange 64, C.I. Pigment Orange 71 and the like. Of these, C.I,. Pigment Orange 71 is particularly preferred.

The colorant contained in the first radiation sensitive composition is particularly preferably a mixture of a quinacridone pigment (1) and an orange pigment. The proportion of the orange pigment therein is generally 40 wt % or less, preferably 35 wt % or less, more preferably 5 to 30 wt %, based on the total weight of all pigments.

The second radiation sensitive composition contains a colorant comprising a mixture of an isoindolinone pigment represented by the above formula (2) and a yellow organic pigment.

The isoindolinone pigment represented by the above formula (2) corresponds to C.I. Pigment Yellow 110 according to color index (C.I.; issued by The Society of Dyers and Colourists) number. The yellow organic pigment is used to control the hue of the obtained pixel.

Illustrative examples of the yellow organic pigment are represented by the following color index numbers: C.I, Pigment Yellow 1, C.I. Pigment Yellow 3, C.I. Pigment Yellow 12, C.I. Pigment Yellow 13, C.I. Pigment Yellow 14, C.I. Pigment Yellow 16, C.I. Pigment Yellow 17, C.I. Pigment Yellow 20, C.I. Pigment Yellow 24, C.I. Pigment Yellow 31, C.I. Pigment Yellow 55, C.I. Pigment Yellow 60, C.I. Pigment Yellow 65, C.I. Pigment Yellow 73, C.I. Pigment Yellow 74, C.I. Pigment Yellow 81, C.I. Pigment Yellow 83, C.I. Pigment Yellow 93, C.I. Pigment Yellow 95, C.I. Pigment Yellow 97, C.I. Pigment Yellow 98, C.I. Pigment Yellow 100, C.I. Pigment Yellow 101, C.I. Pigment Yellow 104, C.I. Pigment Yellow 106, C.I. Pigment Yellow 108, C.I. Pigment Yellow 109, C.I. Pigment Yellow 113, C.I. Pigment Yellow 114, C.I. Pigment Yellow 116, C.I. Pigment Yellow 117, C.I. Pigment Yellow 119, C.I. Pigment Yellow 120, C.I. Pigment Yellow 126, C.I. Pigment Yellow 127, C.I. Pigment Yellow 128, C.I. Pigment Yellow 129, C.I. Pigment Yellow 138, C.I. Pigment Yellow 139, C.I. Pigment Yellow 150, C.I. Pigment Yellow 151, C.I. Pigment Yellow 152, C.I. Pigment Yellow 153, C.I. Pigment Yellow 154, C.I. Pigment Yellow 155, C.I. Pigment Yellow 156, C.I. Pigment Yellow 166, C.I. Pigment Yellow 168, C.I. Pigment Yellow 175 and the like.

The yellow organic pigment listed above may be used alone or in combination of two or more. The proportion of the yellow organic pigment used is preferably 25 wt % or less, more preferably 5 to 25 wt %, particularly preferably 10 to 20 wt % of the total weight of all pigments.

The third radiation sensitive composition contains a colorant comprising a mixture of the copper phthalocyanine blue of the above formula (3) and at least either one of the green pigment of the above formula (4) and the green pigment of the above formula (5). The content of the green pigment is 50 wt % or less, based on the total weight of the copper phthalocyanine blue and the green pigment.

The copper phthalocyanine blue of the above formula (3) is preferably β-type crystalline copper phthalocyanine blue or non-crystalline and non-cohesive copper phthalocyanine blue.

The β-type crystalline copper phthalocyanine blue corresponds to C.I. Pigment Blue 15:3 according to color index (C.I.: issued by The Society of Dyers and Colourists) number and the non-crystalline and non-cohesive copper phthalocyanine blue corresponds to C.I. Pigment Blue 15:4 according to color index (C.I.) number. Of these, C.I. Pigment Blue 15:4 is particularly preferred.

The green pigment is used to control the hue of the obtained pixel.

The green pigment represented by the above formula (4) corresponds to C.I. Pigment Green 7 according to color index (C.I.) number and the green pigment represented by the above formula (5) corresponds to C.I. Pigment Green 36 according to color index (C.I.) number. Of these, C.I. Pigment Green 36 is particularly preferred.

The proportion of the green pigment used is 50 wt % or less, preferably 50 to 10 wt %, more preferably 50 to 25 wt %, based on the total weight of all pigments, as described above.

The first radiation sensitive composition is advantageously used for the production of additive color filter and subtractive color filter to be used in a reflective-type color liquid crystal display device. The second and third radiation sensitive compositions can be advantageously used for the production of a subtractive color filter.

In the present invention, the surface of each pigment may be modified with a polymer. The polymer for modifying the surface of a pigment is, for example, a polymer disclosed by JP-A 8-259876 or a variety of commercial polymers or oligomers for dispersing a pigment.

The pigments used in the present invention can be used in conjunction with a dispersant as desired.

The dispersant is, for example, a cationic, anionic, nonionic, amphoteric, silicone-based or fluorine-based surfactant.

Illustrative examples of the surfactant include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; polyethylene imines; and the like. The surfactant is also available under the trade name of KP (of Shin-Etsu Chemical Co.), Polyflow (of Kyoeisha Kagaku Kabushiki Kaisha), F-Top (Tokem Products Co.), Megafac (Dainippon Ink and Chemicals, Inc.), Florade (Sumitomo 3M Limited), Asahi Guard and Surflon (of Asahi Glass Co.) and the like.

The surfactant listed above can be used alone or in admixture of two or more.

The amount of the surfactant used is generally 50 parts or less by weight, preferably 0 to 30 parts by weight, based on 100 parts by weight of the total of all pigments.

(B) Alkali-soluble Resin

As the alkali-soluble resin in the present invention, any resin can be used as long as it serves as a binder for the colorant (A) and is soluble in a developer, particularly preferably an alkali developer used in a development process in the production of a color filter. The alkali-soluble resin is preferably a carboxyl group-containing polymer, particularly a copolymer (to be simply referred to as "carboxyl group-containing copolymer" hereinafter) of an ethylenically unsaturated monomer having at least one carboxyl group (to be simply referred to as "carboxyl group-containing unsaturated monomer" hereinafter) and other copolymerizable ethylenically unsaturated monomer (to be simply referred to as "copolymerizable unsaturated monomer" hereinafter).

Illustrative examples of the above carboxyl group-containing unsaturated monomer include unsaturated monocarboxylic acids such as acrylic acid, methacrylic acid, crotonic acid, α-chloroacrylic acid and cinammic acid; unsaturated dicarboxylic acids such as maleic acid, maleic anhydride, fumaric acid, itaconic acid, itaconic anhydride, citraconic acid, citraconic anhydride and mesaconic acid, and anhydrides thereof; unsaturated polycarboxylic acids (anhydrides) having a valence of 3 or more; mono[(meth) acryloyloxyalkyl]esters of polycarboxylic acids having a valence of 2 or more, such as mono(2-acryloyloxyethyl) succinate, mono(2-methacryloyloxyethyl) succinate, mono (2-acryloyloxyethyl) phathalate and mono(2-methacryloyloxyethyl) phthalate; mono(meth)acrylates of both-terminal dicarboxy polymers such as ω-carboxy polycaprolactone monoacrylate and ω-carboxypolycaprolactone monomethacrylate; and the like.

These carboxyl group-containing unsaturated monomers can be used alone or in admixture of two or more.

Illustrative examples of the copolymerizable unsaturated monomer include aromatic vinyl compounds such as styrene, α-methylstyrene, o-vinyltoluene, m-vinyltoluene, p-vinyltoluene, p-chlorostyrene, o-methoxystyrene, m-methoxystyrene, p-methoxystyrene, o-vinylbenzylmethyl ether, m-vinylbenzylmethyl ether, p-vinylbenzylmethyl ether, o-vinylbenzylglycidyl ether, m-vinylbenzylglycidyl ether, p-vinylbenzylglycidyl ether and indene; unsaturated carboxylic acid esters such as methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, cyclohexyl acrylate, cyclohexyl methacrylate, phenyl acrylate, phenyl methacrylate, 2-methoxyethyl acrylate, 2-methoxyethyl methacrylate, 2-phenoxyethyl acrylate, 2-phenoxyethyl methacrylate, methoxydiethylene glycol acrylate, methoxydiethylene glycol methacrylate, methoxytriethylene glycol acrylate, methoxytriethylene glycol methacrylate, methoxypropylene glycol acrylate, methoxypropylene glycol methacrylate, methoxydipropylene glycol acrylate, methoxydipropylene glycol methacrylate, isobornyl acrylate, isobornyl methacrylate, dicyclopentadienyl acrylate, dicyclopentadienyl methacrylate, 2-hydroxy-3-phenoxypropyl acrylate and 2-hydroxy-3-phenoxypropyl methacrylate; unsaturated carboxylic acid aminoalkyl esters such as 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminopropyl acrylate, 2-dimethylaminopropyl methacrylate, 3-aminopropyl acrylate, 3-aminopropyl methacrylate, 3-dimethylaminopropyl acrylate and 3-dimethylaminopropyl methacrylate; unsaturated carboxylic acid glycidyl esters such as glycidyl acrylate and glycidyl methacrylate; carboxylic acid vinyl esters such as vinyl acetate, vinyl propionate, vinyl butyrate and vinyl benzoate; unsaturated ethers such as vinylmethyl ether, vinylethyl ether and allylglycidyl ether; vinyl cyanide compounds such as acrylonitrile, methacrylonitrile, α-chloroacrylonitrile and vinylidene cyanide; unsaturated amides such as acrylamide, methacrylamide, α-chloroacrylamide, N-2-hydroxyethyl acrylamide and N-2-hydroxyethyl methacrylamide; unsaturated imides such as maleimide, N-phenyl maleimide and N-cyclohexyl maleimide; aliphatic conjugated dienes such as 1,3-butadiene, isoprene and chloroprene; macromonomers having a monoacryloyl group or monomethacryloyl group at the terminal of a polymer molecular chain, such as polystyrene, polymethyl acrylate, polymethyl methacrylate, poly-n-butyl acrylate, poly-n-butyl methacrylate and polysiloxanes; and the like.

These copolymerizable unsaturated monomers can be used alone or in admixture of two or more.

The carboxyl group-containing copolymer in the present invention is preferably a copolymer (to be referred to as "carboxyl group-containing copolymer (I)" hereinafter) of (1) a carboxyl group-containing unsaturated monomer component comprising acrylic acid and/or methacrylic acid as an essential component and, in addition, mono(2-acryloyloxyethyl)succinate and/or mono(2-methacryloyloxyethyl)succinate as the case may be and (2) at least one selected from the group consisting of styrene, methyl acrylate, methyl methacrylate, 2-hydroxyethyl acrylate, 2-hydroxyethyl methacrylate, allyl acrylate, allyl methacrylate, benzyl acrylate, benzyl methacrylate, N-phenyl maleimide, polystyrene macromonomer and polymethyl methacrylate macromonomer.

Illustrative examples of the carboxyl group-containing copolymer (I) include (meth)acrylic acid/methyl (meth)acrylate copolymer; (meth)acrylic acid/benzyl (meth)acrylate copolymer; (meth)acrylic acid/2-hydroxyethyl (meth)acrylate/benzyl (meth)acrylate copolymer; (meth)acrylic acid/methyl (meth)acrylate/polystyrene macromonomer copolymer, (meth)acrylic acid/methyl (meth)acrylate/polymethyl methacrylate macromonomer copolymer; (meth)acrylic acid/benzyl (meth)acrylate/polystyrene macromonomer copolymer; (meth)acrylic acid/benzyl (meth)acrylate/polymethyl methacrylate macromonomer copolymer; (meth)acrylic acid/2-hydroxyethyl (meth)acrylate/benzyl (meth)acrylate/polystyrene macromonomer copolymer; (meth)acrylic acid/2-hydroxyethyl (meth)acrylate/benzyl (meth)acrylate/polymethyl methacrylate macromonomer copolymer; methacrylic acid/styrene/benzyl methacrylate/N-phenyl maleimide copolymer; methacrylic acid/mono(2-acryloyloxyethyl) succinate/styrene/benzyl methacrylate/N-phenyl maleimide copolymer; methacrylic acid/mono(2-acryloyloxyethyl) succinate/styrene/allyl methacrylate/N-phenyl maleimide copolymer; and the like.

The proportion of the carboxyl group-containing unsaturated monomer in the carboxyl group-containing copolymer is generally 5 to 50 wt %, preferably 10 to 40 wt %. When the proportion is less than 5 wt %, the solubility of the obtained radiation sensitive composition in an alkali developer is liable to lower. On the other hand, when the proportion is more than 50 wt %, the solubility becomes too high, whereby the formed pixels are liable to fall off from the substrate, or the surface of each of the pixels is liable to be roughened at the time of development with an alkali developer.

The weight-average molecular weight in terms of polystyrene (to be abbreviated as Mw hereinafter), measured by gel permeation chromatography (GPC, dissolving solvent: tetrahydrofuran), of the alkali-soluble resin in the present invention is generally 3,000 to 300,000, preferably 5,000 to 100,000. Using an alkali-soluble resin having the Mw in the above specific range, a radiation sensitive composition having excellent developability can be obtained, whereby pixels having a sharp pattern edge can be formed and stains and film residues are hardly produced in an area other than a portion where pixels are formed on the substrate at the time of development.

In the present invention, alkali-soluble resins can be used alone or in admixture of two or more.

The amount of the alkali-soluble resin used in the present invention is generally 10 to 1,000 parts by weight, preferably 20 to 500 parts by weight, based on 100 parts by weight of the colorant (A). When the amount of the alkali-soluble resin used is less than 10 parts by weight, for example, alkali developability may deteriorate, and stains and film residues are liable to be produced in an area other than a portion where pixels are formed on the substrate. On the other hand, when the amount is more than 1,000 parts by weight, it may be difficult to achieve a color density required for a color filter due to a relative reduction in the concentration of the pigment.

(C) Polyfunctional Monomer

The polyfunctional monomer in the present invention is a monomer having two or more polymerizable unsaturated bonds.

Illustrative examples of the polyfunctional monomer include diacrylates and dimethacrylates of alkylene glycol such as ethylene glycol and propylene glycol; diacrylates and dimethacrylates of polyalkylene glycol such as polyethylene glycol and polypropylene glycol; polyacrylates and polymethacrylates of polyhydric alcohols having a valence of 3 or more such as glycerine, trimethylolpropane, pentaerythritol and dipentaerythritol, and dicarboxylic acid modified products thereof; oligoacrylates and oligomethacrylates such as polyesters, epoxy resins, urethane resins, alkyd resins, silicone resins and spiran resins; diacrylates and dimethacrylates of both terminal hydroxylated polymers such as both terminal hydroxypoly-1,3-butadiene, both terminal hydroxypolyisoprene and both terminal hydroxypolycaprolactone; tris(2-acryloyloxyethyl)phosphate, tris(2-methacryloyloxyethyl)phosphate and the like.

Out of these polyfunctional monomers, preferred are polyacrylates and polymethacrylates of polyhydric alcohols having a valence of 3 or more and dicarboxylic acid modified products thereof, such as trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, and compounds represented by the following formula (2), and particularly preferred are trimethylolpropane triacrylate, pentaerythritol triacrylate and dipentaerythritol hexaacrylate because they have a high pixel strength and an excellent smooth pixel surface and hardly produce stains or film residues in an area other than a portion where pixels are formed.

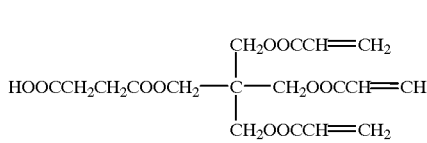

(2)

The above polyfunctional monomers can be used alone or in admixture of two or more.

The amount of the polyfunctional monomer used in the present invention is generally 5 to 500 parts by weight, preferably 20 to 300 parts by weight, based on 100 parts by weight of the alkali-soluble resin (B). When the amount of the polyfunctional monomer used is less than 5 parts by weight, the strength and surface smoothness of the obtained pixel may deteriorate. On the other hand, when the amount is more than 500 parts by weight, alkali developability may lower, and stains or film residues are liable to be produced in an area other than a portion where pixels are formed on the substrate.

In the present invention, a monofunctional monomer can be used in combination with the above polyfunctional monomer as required.

Illustrative examples of the monofunctional monomer include carboxyl group-containing unsaturated monomers and copolymerizable unsaturated monomers listed for the above carboxyl group-containing copolymer, M-5300 (trade name, manufactured by Toagosei Chemical Industry Co., Ltd.) and the like.

These monofunctional monomers can be used alone or in admixture of two or more.

The proportion of the monofunctional monomer used is generally 90 wt % or less, preferably 0 to 50 wt %, based on the total of the polyfunctional monomer and the monofunctional monomer. When the proportion is more than 90 wt %, the strength and surface smoothness of the obtained pixel may be insufficient.

(D) Photopolymerization Initiator

The term "photopolymerization initiator" as used in the present invention refers to a compound which causes decomposition or the cleavage of a bond and forms an active species capable of initiating the polymerization of the above polyfunctional monomer (C), such as a radical, cation or anion, when exposed to radiation such as visible light, ultraviolet light, far ultraviolet light, electron beam or X-ray (to be referred to as "exposure" hereinafter).

Illustrative examples of the photopolymerization initiator include imidazole-based compounds having at least one main skeleton represented by the following formulas (3), (4) or (5), benzoin-based compounds, acetophenone-based compounds, benzophenone-based compounds, α-diketone-based compounds, polynuclear quinone-based compounds, xanthone-based compounds, diazo-based compounds, triazine-based compounds and the like.

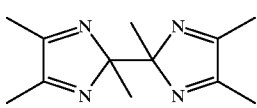
(3)

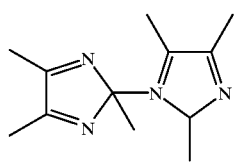
(4)

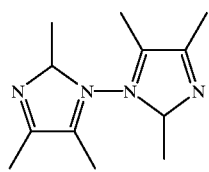
(5)

The imidazole-based compounds include, for example, 2,2'-bis(2-chlorophenyl)-4,4',5,5'-tetrakis(4-methoxycarbonylphenyl)-1,2'-biimidazole, 2,2'-bis(2-chlorophenyl)-4,4',5,5'-tetrakis(4-ethoxycarbonylphenyl)-1,2'-biimidazole, 2,2'-bis(2-chlorophenyl)-4,4',5,5'-tetrakis(4-phenoxycarbonylphenyl)-1,2'-biimidazole, 2,2'-bis(2,4-dichlorophenyl)-4,4',5,5'-tetrakis(4-methoxycarbonylphenyl)-1,2'-biimidazole, 2,2'-bis(2,4-dichlorophenyl)-4,4',5,5'-tetrakis(4-ethoxycarbonylphenyl)-1,2'-biimidazole, 2,2'-bis(2,4-dichlorophenyl)-4,4',5,5'-tetrakis(4-phenoxycarbonylphenyl)-1,2'-biimidazole, 2,2'-bis(2,4,6-trichlorophenyl)-4,4',5,5'-tetrakis(4-methoxycarbonylphenyl)-1,2'-biimidazole, 2,2'-bis(2,4,6-trichlorophenyl)-4,4',5,5'-tetrakis(4-ethoxycarbonylphenyl)-1,2'-biimidazole, 2,2'-bis(2,4,6-trichlorophenyl)-4,4',5,5'-tetrakis(4-phenoxycarbonylphenyl)-1,2'-biimidazole, 2,2'-bis(2-bromophenyl)-4,4',5,5'-tetrakis(4-methoxycarbonylphenyl)-1,2'-biimidazole, 2,2'-bis(2-bromophenyl)-4,4',5,5'-tetrakis(4-ethoxycarbonylphenyl)-1,2'-biimidazole, 2,2'-bis(2-bromophenyl)-4,4',5,5'-tetrakis(4-phenoxycarbonylphenyl)-1,2'-biimidazole, 2,2'-bis(2,4-dibromophenyl)-4,4',5,5'-tetrakis(4-methoxycarbonylphenyl)-1,2'-biimidazole, 2,2'-bis(2,4-dibromophenyl)-4,4',5,5'-tetrakis(4-ethoxycarbonylphenyl)-1,2'-biimidazole, 2,2'-bis(2,4-dibromophenyl)-4,4',5,5'-tetrakis(4-phenoxycarbonylphenyl)-1,2'-biimidazole, 2,2'-bis(2,4,6-tribromophenyl)-4,4',5,5'-tetrakis(4-methoxycarbonylphenyl)-1,2'-biimidazole, 2,2'-bis(2,4,6-tribromophenyl)-4,4',5,5'-tetrakis(4-ethoxycarbonylphenyl)-1,2'-biimidazole, 2,2'-bis(2,4,6-tribromophenyl)-4,4',5,5'-tetrakis(4-phenoxycarbonylphenyl)-1,2'-biimidazole, 2,2'-bis(2-cyanophenyl)-4,4',5,5'-tetrakis(4-methoxycarbonylphenyl)-1,2'-biimidazole, 2,2'-bis(2-cyanophenyl)-4,4',5,5'-tetrakis(4-ethoxycarbonylphenyl)-1,2'-biimidazole, 2,2'-bis(2-cyanophenyl)-4,4',5,5'-tetrakis(4-phenoxycarbonylphenyl)-1,2'-biimidazole, 2,2'-bis(2-methylphenyl)-4,4',5,5'-tetrakis(4-methoxycarbonylphenyl)-1,2'-biimidazole, 2,2'-bis(2-methylphenyl)-4,4',5,5'-tetrakis(4-ethoxycarbonylphenyl)-1,2'-biimidazole, 2,2'-bis(2-methylphenyl)-4,4',5,5'-tetrakis(4-phenoxycarbonylphenyl)-1,2'-biimidazole, 2,2'-bis(2-ethylphenyl)-4,4',5,51-tetrakis(4-methoxycarbonylphenyl)-1,2'-biimidazole, 2,2'-bis(2-ethylphenyl)-4,4',5,5'-tetrakis(4-ethoxycarbonylphenyl)-1,2'-biimidazole, 2,2'-bis(2-ethylphenyl)-4,4',5,5'-tetrakis(4-phenoxycarbonylphenyl)-1,2'-biimidazole, 2,2'-bis(2-phenylphenyl)-4,4',5,5'-tetrakis(4-methoxycarbonylphenyl)-1,2'-biimidazole, 2,2'-bis(2-phenylphenyl)-4,4',5,5'-tetrakis(4-ethoxycarbonylphenyl)-1,2'-biimidazole, 2,2'-bis(2-phenylphenyl)-4,4',5,5'-tetrakis(4-phenoxycarbonylphenyl)-1,2'-biimidazole, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2-bromophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-tribromophenyl)-4,4',5,5'-tetraphenyl-1,2'-biimidazole, 2,2'-bis(2-cyanophenyl)-4,4',5,5'-tetraphenyl-1,2'-biimidazole, 2,2'-bis(2,4-dicyanophenyl)-4,4',5,5'-tetraphenyl-1,2'-biimidazole, 2,2'-bis(2,4,6-tricyanophenyl)-4,4',5,5'-tetraphenyl-1,2'-biimidazole, 2,2'-bis(2-methylphenyl)-4,4',5,5'-tetraphenyl-1,2'-biimidazole, 2,2'-bis( 2,4-dimethylphenyl)-4,4',5,5'-tetraphenyl-1,2'-biimidazole, 2,2'-bis(2,4,6-trimethylphenyl)-4,4',5,5'-tetraphenyl-1,2'-biimidazole, 2,2'-bis(2-ethylphenyl)-4,4',5,5'-tetraphenyl-1,2'-biimidazole, 2,2'-bis(2,4-diethylphenyl)-4,4',5,5'-tetraphenyl-1,2'-biimidazole, 2,2'-bis(2,4,6-triethylphenyl)-4,4',5,5'-tetraphenyl-1,2'-biimidazole, 2,2'-bis(2-phenylphenyl)-4,4',5,5'-tetraphenyl-1,2'-biimidazole, 2,2'-bis(2,4-diphenylphenyl)-4,4',5,51-tetraphenyl-1,2'-biimidazole, 2,2'-bis(2,4,6-triphenylphenyl)-4,4',5,5'-tetraphenyl-1,2'-biimidazole, and the like.

Out of these biimidazole-based compounds, particularly preferred are 2,2'-bis(2-chlorophenyl)-4,4',5,5'-tetrakis(4-ethoxycarbonylphenyl)-1,2'-biimidazole, 2,2'-bis(2-bromophenyl)-4,4',5,5'-tetrakis(4-ethoxycarbonylphenyl)-1, 2'-biimidazole, 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole and 2,2'-bis(2,4,6-tribromophenyl)-4,4',5,5'-tetraphenyl-1,2'-biimidazole.

The above biimidazole-based compounds have excellent solubility in a solvent, do not produce foreign matters such as undissolved substance or deposits, are very sensitive, promote a curing reaction thoroughly by exposure with a small amount of energy, give high contrast, and do not cause a curing reaction in unexposed portions. Therefore, the coating film after exposure is clearly divided into cured portions insoluble in a developer and uncured portions highly soluble in the developer, whereby an undercutless pixel pattern can be obtained and an array of high-definition pixels arranged according to a predetermined pattern can be formed.

The above benzoin-based compounds include, for example, benzoin, benzoin methyl ether, benzoin ethyl ether, benzoin i-propyl ether, benzoin i-butyl ether, methyl-2-benzoyl benzoate and the like.

The above acetophenone-based compounds include, for example, 2,2-dimethoxy-2-phenylacetophenone, 2-hydroxy-2-methyl-1-phenylpropane-1-one, 1-(4-i-propylphenyl)-2-hydroxy-2-methylpropane-1-one, 4-(2-hydroxyethoxy)phenyl-(2-hydroxy-2-propyl)ketone, 2,2-dimethoxyacetophenone, 2,2-diethoxyacetophenone, 2-methyl-(4-methylthiophenyl)-2-morpholino-1-propane-1-one, 2-benzyl-2-dimethylamino-1-(4-morpholinophenyl) butane-1-one, 1-hydroxycyclohexylphenyl ketone, 2,2'-dimethoxy-1,2-diphenylethane-1-one, 4-azidoacetophenone, 4-azidobenzalacetophenone and the like.

The above benzophenone-based compounds include, for example, benzophenone, 4,4'-bis(dimethylamino) benzophenone, 4,4'-bis(diethylamino)benzophenone, 3,3'-dimethyl-4-methoxybenzophenone and the like.

The α-diketone-based compounds include, for example, diacetyl, dibenzoyl, methylbenzoyl formate and the like.

The above polynuclear quinone-based compounds include, for example, anthraquinone, 2-ethylanthraquinone, 2-t-butylanthraquinone, 1,4-naphthoquinone and the like.

The above xanthone-based compounds include, for example, xanthone, thioxanthone, 2,4-diethylthioxanthone, 2-chlorothioxanthone and the like.

The above diazo-based compounds include, for example, 4-diazodiphenylamine, 4-diazo-4'-methoxydiphenylamine, 4-diazo-3-methoxydiphenylamine and the like.

The above triazine-based compounds include, for example, 2-(2'-furylethylidene)-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)-4,6-bis(trichloromethyl)-s-triazine, 2-(2'-thiophenylethylidene)-4,6-bis(trichloromethyl)-s-triazine and the like.

Photopolymerization initiators other than the above photopolymerization initiators include 4-azidobenzaldehyde, azidopyrene, bis(2,6-dimethoxybenzoyl)-2,4,4-trimethylpentylphosphine oxide, N-phenylthioacridone, triphenylpyrylium perchlorate and the like.

The photopolymerization initiator listed above can be used alone or in admixture of two or more.

The amount of the photopolymerization initiator used in the present invention is generally 0.01 to 200 parts by weight, preferably 1 to 120 parts by weight, particularly preferably 1 to 50 parts by weight, based on 100 parts by weight of the total of the polyfunctional monomer (C) and the monofunctional monomer which is used as the case may be. When the amount of the photopolymerization initiator is less than 0.01 part by weight, curing by exposure may be insufficient, thereby making it difficult to obtain an array of pixels arranged according to a predetermined pattern. On the other hand, when the amount is more than 200 parts by weight, the formed pixels easily fall off from the substrate at the time of development, and stains or film residues are easily produced in an area other than a portion where the pixels are formed on the substrate.

Further, in the present invention, at least one of a sensitizer, curing promoting agent and polymer photocrosslinking-sensitizing agent (to be generally and inclusively referred to as "curing aids" hereinafter) can be used in conjunction with the above photopolymerization initiator as required.

Illustrative examples of the sensitizer include 4-diethylaminoacetophenone, 4-dimethylaminopropiophenone, ethyl-4-dimethylaminobenzoate, 2-ethylhexyl-1,4-dimethylaminobenzoate, 2,5-bis(4'-diethylaminobenzal) cyclohexanone, 7-diethylamino-3-(4-diethylaminobenzoyl) coumarin, 4-(diethylamino)chalcone and the like.

The sensitizer listed above can be used alone or in admixture of two or more.

Illustrative examples of the curing promoting agent include chain transfer agents such as 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, 1-phenyl-5-mercapto-1H-tetrazole and 3-mercapto-4-methyl-4H-1,2,4-triazole and the like.

The curing promoting agent listed above can be used alone or in admixture of two or more.

The above polymer photocrosslinking-sensitizing agent is a polymer compound which has at least one functional group in the main chain and/or side chain and which can serve as a crosslinking agent and/or sensitizer when exposed to radiation. Illustrative examples of the photocrosslinking•sensitizing agent include condensates of 4-azidobenzaldehyde and polyvinyl alcohols, condensates of 4-azidobenzaldehyde and phenolic novolak resins, homopolymers and copolymers of 4-acryloylphenylcinnamoyl esters, 1,4-polybutadiene, 1,2-polybutadiene and the like.

The polymer photocrosslinking•sensitizing agent listed above can be used alone or in admixture of two or more.

The amount of the curing aids used is generally 300 parts or less by weight, preferably 5 to 200 parts by weight, more preferably 10 to 100 parts by weight, based on 100 parts by weight of the photopolymerization initiator (D).

In the present invention, a combination of a biimidazole-based compound and a benzophenone-based compound as a photopolymerization initiator and/or a thiazole-based curing promoting agent is particularly preferably used because the formed pixels rarely fall off from the substrate at the time of development and the strength and sensitivity of the pixels are high.

In the present invention, when a combination of a biimidazole-based compound and another component is used as a photopolymerization initiator, the proportion of the another component is preferably 80 wt % or less, based on the total weight of the photopolymerization initiator.

Particularly preferred combinations of constituent components of the photopolymerization initiator are 2,2'-bis(2-chlorophenyl)-4,4',5,5'-tetrakis(4-ethoxycarbonylphenyl)-1,2'-biimidazole/4,4'-bis(diethylamino)benzophenone, 2,2'-bis(2-chlorophenyl)-4,4',5,5'-tetrakis(4-ethoxycarbonylphenyl)-1,2'-biimidazole/4,4'-bis(diethylamino)benzophenone/2-benzyl-2-dimethylamino-1-(4-morpholinophenyl)butane-1-one, 2,2'-bis(2-chlorophenyl)-4,4',5,5'-tetrakis(4-ethoxycarbonylphenyl)-1,2'-biimidazole/4,4'-bis(diethylamino)benzophenone/1-hydroxycyclohexylphenyl ketone, 2,2'-bis(2-chlorophenyl)-4,4',5,5'-tetrakis(4-ethoxycarbonylphenyl)-1,2'-biimidazole/4,4'-bis(dimethylamino)benzophenone/1-hydroxycyclohexylphenyl ketone/2-mercaptobenzothiazole, 2,2'-bis(2,4-dichlorophenyl)-4,4',5,5'-tetraphenyl-1,2'-biimidazole/4,4'-bis(diethylamino)benzophenone, 2,2'-bis (2,4-dichlorophenyl)-4,4',5,5'-tetraphenyl-1,2'-biimidazole/ 4,4'-bis(diethylamino)benzophenone/2-benzyl-2-dimethylamino-1-(4-morpholinophenyl)butane-1-one, 2,2'-bis(2,4-dichlorophenyl)-4,4',5,5'-tetraphenyl-1,2'-biimidazole/4,4'-bis(diethylamino)benzophenone/2-benzyl-2-dimethylamino-1-(4-morpholinophenyl)butane-1-one/2-mercaptobenzothiazole, 2,2'-bis(2,4-dibromophenyl)-4,4',5, 5'-tetraphenyl-1,2'-biimidazole/4,4'-bis(diethylamino) benzophenone/2-benzyl-2-dimethylamino-1-(4-morpholinophenyl)butane-1-one, 2,2'-bis(2,4-dibromophenyl)-4,4',5,5'-tetraphenyl-1,2'-biimidazole/4,4'-bis(diethylamino)benzophenone/1-hydroxycyclohexylphenyl ketone, and 2,2'-bis(2,4,6-trichlorophenyl)-4,4',5,5'-tetraphenyl-1,2'-biimidazole/4,4'-bis(dimethylamino)benzophenone/1-hydroxycyclohexylphenyl ketone/2-mercaptobenzothiazole.

Other Additives

The radiation sensitive composition of the present invention can contain an organic acid to improve its solubility in an alkali developer and to further suppress the generation of undissolved substance after development.

The organic acid is preferably an aliphatic carboxylic acid and phenyl group-containing carboxylic acid having a molecular weight of 1,000 or less.

Illustrative examples of the aliphatic carboxylic acid include monocarboxylic acids such as formic acid, acetic acid, propionic acid, butyric acid, valeric acid, pivalic acid, caproic acid, diethylacetic acid, enanthic acid and caprylic acid; dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, cyclohexanedicarboxylic acid, itaconic acid, citraconic acid, maleic acid, fumaric acid and mesaconic acid; tricarboxylic acids such as tricarballylic acid, aconitic acid and camphoronic acid; and the like.

The phenyl group-containing carboxylic acid is an aromatic carboxylic acid having a carboxyl group directly bonded to a phenyl group or a carboxylic acid having a carboxyl group bonded to a phenyl group through a carbon chain.

Illustrative examples of the phenyl group-containing carboxylic acid include aromatic monocarboxylic acids such as benzoic acid, toluic acid, cuminic acid, hemellitic acid and mesitylenic acid; aromatic dicarboxylic acids such as phthalic acid, isophthalic acid and terephthalic acid; aromatic polycarboxylic acids having a valence of 3 or more such as trimellitic acid, trimesic acid, mellophanic acid and pyromellitic acid; phenylacetic acid; hydroatropic acid; hydrocinnamic acid; mandelic acid; phenylsuccinic acid; atropic acid; cinnamic acid; cinnamylidenic acid; coumaric acid; umbellic acid; and the like.

Out of these organic acids, aliphatic dicarboxylic acids and aromatic dicarboxylic acids such as malonic acid, adipic acid, itaconic acid, citraconic acid, fumaric acid, mesaconic acid and phthalic acid are preferred in view of alkali solubility, solubility in a solvent and the prevention of stains and film residues in an area other than a portion where pixels are formed on the substrate.

The above organic acid listed above can be used alone or in admixture of two or more.

The proportion of the organic acid used is generally 10 wt % or less, preferably 5 wt % or less, more preferably 1 wt % or less, based on the radiation sensitive composition. When the proportion of the organic acid is more than 10 wt %, the adhesion of the formed pixels to the substrate is liable to deteriorate.

The radiation sensitive composition of the present invention can further contain various additives other than the above organic acids.

Such additives include, for example, dispersion aids such as blue pigment derivatives and yellow pigment derivatives exemplified by copper phthalocyanine derivatives; fillers such as glass and alumina; polymer compounds such as polyvinyl alcohols, polyethylene glycol monoalkyl ethers and poly(chloroalkylacrylates); adhesion promoting agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidylpropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane; antioxidants such as 2,2-thiobis(4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; agglomeration prevention agents such as sodium polyacrylates; heat crosslinking agents such as epoxy compounds, melamine compounds and bisazido compounds; the like.

Solvent

The radiation sensitive composition of the present invention comprises the above components (A) to (D) as essential ingredients and other additives as the case may be, and is generally prepared as a liquid composition by adding a solvent.

Any solvent is acceptable as the above solvent, as long as it dissolves or disperses the above components constituting the radiation sensitive composition, does not react with these components and exhibits appropriate volatility.

Illustrative examples of the solvent include (poly) alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, propylene glycol monomethyl ether acetate and propylene glycol monoethyl ether acetate; other ethers such as diethylene glycol dimethyl ether, diethylene glycol methylethyl ether, diethylene glycol diethyl ether and tetrahydrofuran; ketones such as methyl ethyl ketone, cyclohexanone, 2-heptanone and 3-heptanone; lactic acid alkyl esters such as methyl 2-hydroxypropionic acid and ethyl 2-hydroxypropionic acid; other esters such as ethyl 2-hydroxy-2-methylpropionic acid, methyl 3-methoxypropionic acid, ethyl 3-methoxypropionic acid, methyl 3-ethoxypropionic acid, ethyl 3-ethoxypropionic acid, ethyl ethoxyacetic acid, ethyl hydroxyacetic acid, methyl 2-hydroxy-3-methylbutanoic acid, 3-methyl-3-methoxybutyl acetate, 3-methyl-3-methoxybutyl propionate, ethyl acetate, n-butyl acetate, i-butyl acetate, n-amyl formate, i-amyl acetate, n-butyl propionate, i-propyl butyrate, ethyl butyrate, n-butyl butyrate, methylpyruvic acid, ethylpyruvic acid, n-propylpyruvic acid, methyl acetoacetate, ethyl acetoacetate and ethyl 2-oxobutanoic acid; aromatic hydrocarbons such as toluene and xylene; amides such as N-methylpyrrolidone, N,N-dimethylformamide and N,N-dimethylacetoamide; and the like.

Of these, ethylene glycol monomethyl ether acetate, propylene glycol monomethyl ether, propylene glycol monomethyl ether acetate, propylene glycol monoethyl ether acetate, diethylene glycol dimethyl ether, diethylene glycol methylethyl ether, cyclohexanone, 2-heptanone, 3-heptanone, ethyl 2-hydroxypropionic acid, 3-methyl-3-methoxybutyl propionate, ethyl 3-methoxypropionic acid, methyl 3-ethoxypropionic acid, ethyl 3-ethoxypropionic acid, n-butyl acetate, i-butyl acetate, n-amyl formate, i-amyl acetate, n-butyl propionate, ethyl butyrate, i-propyl butyrate, n-butyl butyrate and ethylpyruvic acid are preferred in view of solubility, pigment dispersibility and application properties.

The solvent listed above can be used alone or in admixture of two or more.

The solvent can be used in conjunction with a high-boiling solvent such as benzylethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate or phenyl cellosolve acetate.

Out of the above high-boiling solvents, γ-butyrolactone is preferred.

The high-boiling solvent listed above can be used alone or in admixture of two or more.

The proportion of the solvent is not particularly limited, but it is desirably contained in such an amount that the total concentration of the components, excluding the solvent, contained in the composition is to be generally 5 to 50 wt %, preferably 10 to 40 wt %, in view of the application properties and stability of the obtained radiation sensitive composition.

The following examples are provided for the purpose of further illustrating the present invention, while the present invention shall not be limited thereto.

EXAMPLE 1

100 parts by weight of a mixture of C.I. Pigment Violet 19 and C.I. Pigment Orange 71 in a weight ratio of 75/25 as the colorant (A1), 60 parts by weight of a methacrylic acid/2-hydroxyethyl methacrylate/benzyl methacrylate copolymer (weight ratio=15/15/70, Mw=28,000) as the alkali-soluble resin (B), 40 parts by weight of dipentaerythritol hexaacrylate as the polyfunctional monomer (C), 10 parts by weight of 2,2'-bis(2,4-dichlorophenyl)-4,4',5,5'-tetraphenyl-1,2'-biimidazole and 10 parts by weight of 4,4'-bis(diethylamino) benzophenone as the photopolymerization initiator (D), and 1,000 parts by weight of ethyl 3-ethoxypropionic acid as a solvent were mixed together to prepare a liquid radiation sensitive composition (composition 1).

[Production of color filter]

A red striped color filter was produced on a transparent substrate using the above liquid composition as follows.

The liquid composition was applied to the surface of a soda glass substrate having an $SiO_2$ film formed thereon for preventing the dissolution of sodium ions using a spin coater, and the resulting substrate was prebaked in a clean oven heated at 80° C. for 10 minutes to form a 0.8-μm-thick coating film.

Thereafter, the substrate was cooled to room temperature and exposed to ultraviolet light having a wavelength of 365 nm, 405 nm and 436 nm with a dosage of 200 mJ/cm$^2$ through a photomask using a high-pressure mercury lamp. This substrate was then immersed in a 0.04-wt % aqueous solution of potassium hydroxide heated at 23° C. for 1 minute for development, washed with super purified water and dried. Thereafter, the substrate was post-baked in the clean oven heated at 230° C. for 30 minutes to produce a red striped color filter on the soda glass substrate.

[Evaluation of color filter]

The obtained color filter was evaluated as follows.

Heat Resistance

The chromaticity (α) of the color filter right after its production and the chromaticity (β) of the color filter after 1 hour of heating at 250° C. were measured with a microanalyzer (TC-1800M of Tokyo Denshoku Co., Ltd.). The heat resistance of the color filter was evaluated based on the difference (ΔEab) between the chromaticity (β) and the chromaticity (α). ΔEab was 1.75.

Light Resistance

The color filter produced in the same manner as described above was exposed to ultraviolet light using a ultraviolet long-life fade meter (of Suga Shikenki Co., Ltd.) to measure the chromaticity (γ) of the color filter after 90 hours of exposure using a microanalyzer (TC-1800M of Tokyo Denshoku Co., Ltd.). The light resistance of the color filter was evaluated based on the difference (ΔEab) of the chromaticity (γ) and the chromaticity (α) of the color filter right after its production. As a result, ΔEab was 1.85.

Spectral Transmittance

The spectral transmittance of the color filter was measured using a microanalyzer (TC-1800M of Tokyo Denshoku Co., Ltd.). The measurement result is shown in FIG. 1. This color filter had a high spectral transmittance at a wavelength of 500 nm or less and a wavelength of 610 nm.

COMPARATIVE EXAMPLE 1

A liquid composition was prepared and a color filter was produced and evaluated in the same manner as in Example 1 except that 100 parts by weight of a mixture of C.I. Pigment Red 177 and C.I. Pigment Violet 23 in a weight ratio of 70/30 were used as the colorant (A).

Figure 2:
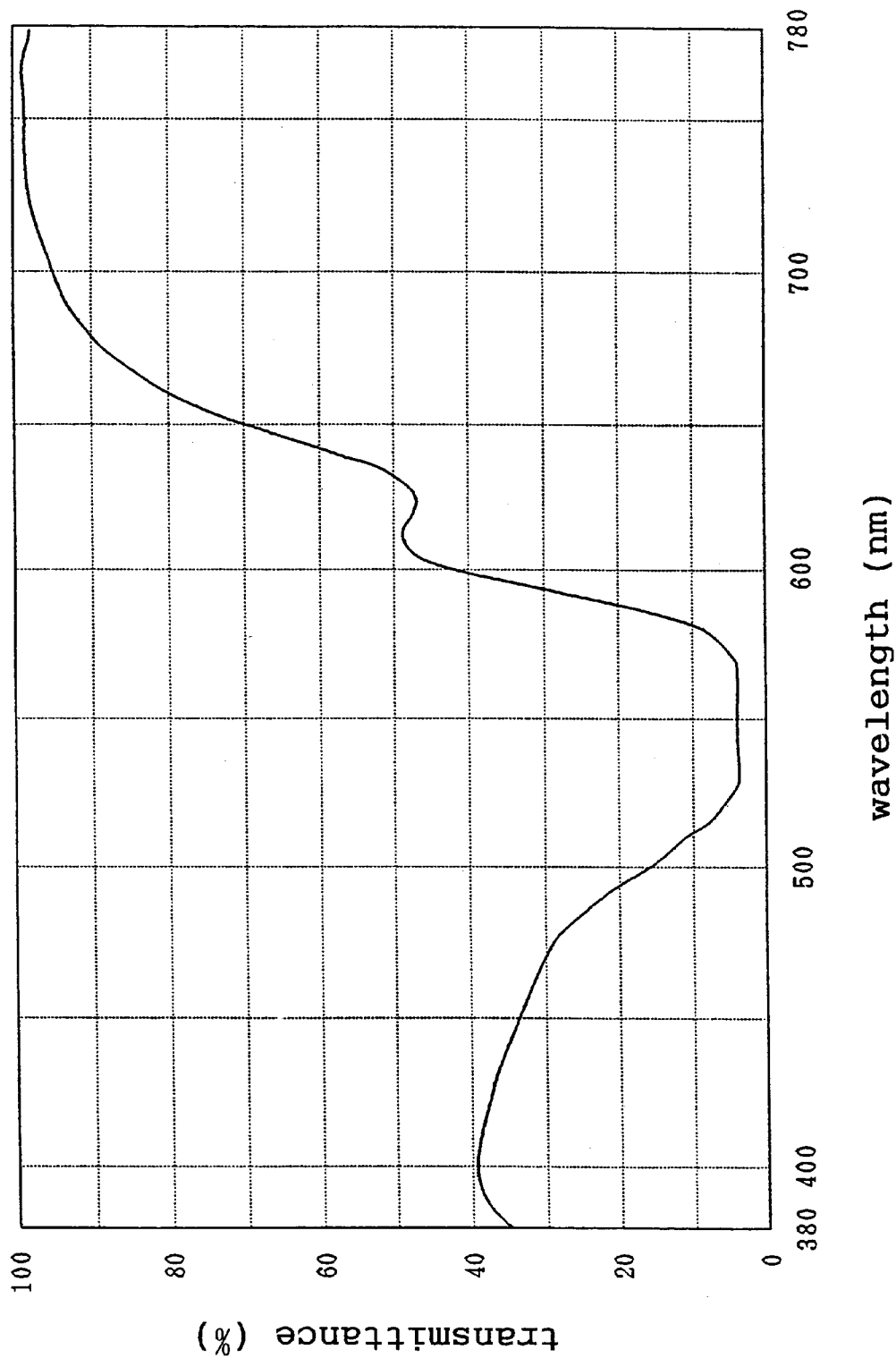
FIG. 2 shows the measurement result of the spectral transmittance of a color filter produced using a comparative radiation sensitive composition (Comparative Example 1)

As a result, this color filter had ΔEab of 2.10 for heat resistance and ΔEab of 2.31 for light resistance, which were insufficient. The measurement result of the spectral transmittance of this color filter is shown in FIG. 2. This color filter had a low spectral transmittance at a wavelength of 500 nm or less and a wavelength of 610 nm.

COMPARATIVE EXAMPLE 2

A liquid composition was prepared and a color filter was produced and evaluated in the same manner as in Example 1 except that 100 parts by weight of a mixture of C.I. Pigment Red 177 and C.I. Pigment Yellow 83 in a weight ratio of 90/10 were used as the colorant (A).

Figure 3:
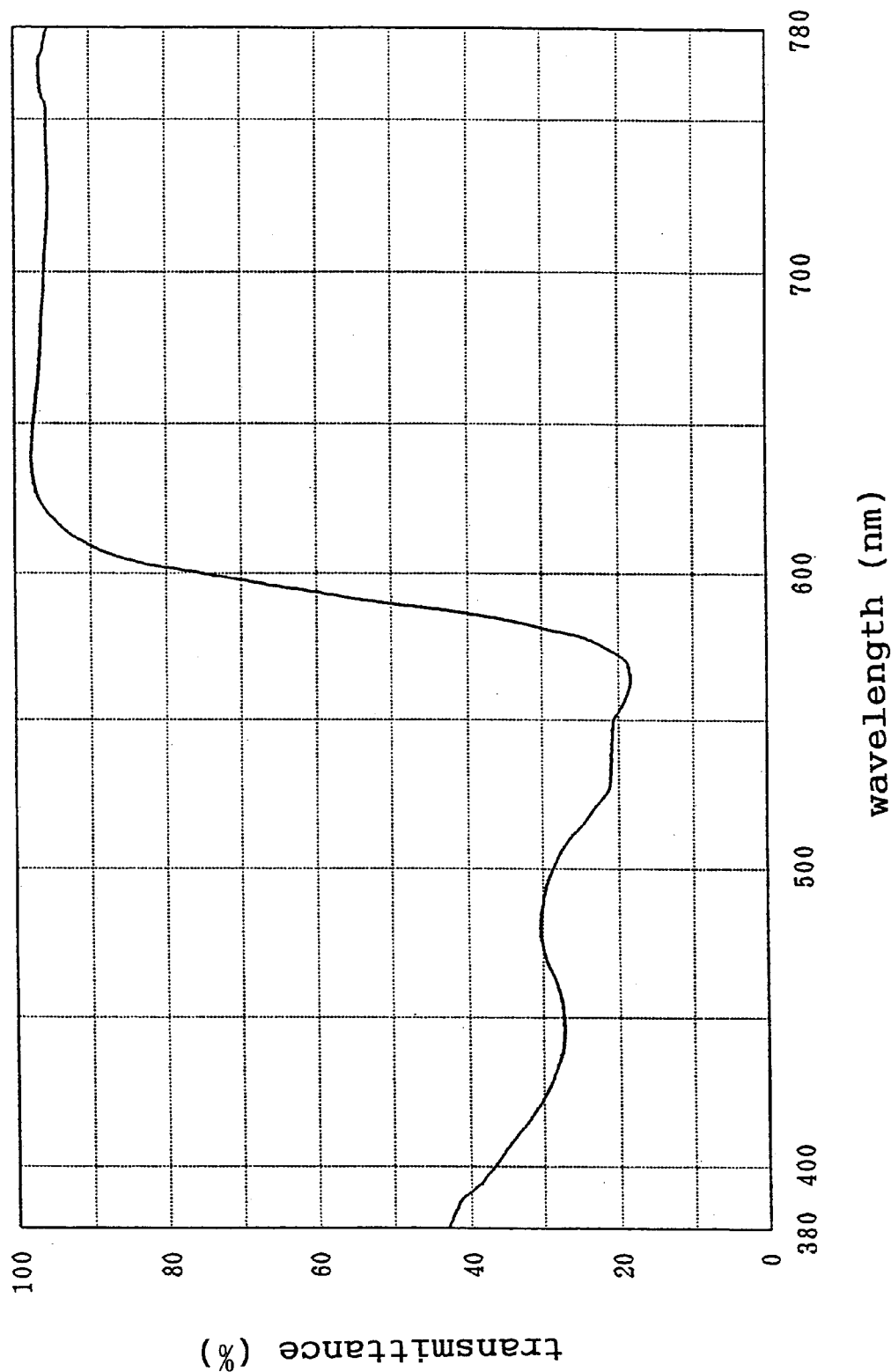
FIG. 3 shows the measurement result of the spectral transmittance of a color filter produced using another comparative radiation sensitive composition (Comparative Example 2)

As a result, this color filter had ΔEab of 2.05 for heat resistance and ΔEab of 2.12 for light resistance, which were insufficient. The measurement result of the spectral transmittance of this color filter is shown in FIG. 3. This color filter had a low spectral transmittance especially at a wavelength of 500 nm or less.

EXAMPLE 2

100 parts by weight of a mixture of C.I. Pigment Yellow 110 and C.I. Pigment Yellow 83 in a weight ratio of 85/15 as the colorant (A2), 60 parts by weight of a methacrylic acid/benzyl methacrylate/2-hydroxyethyl methacrylate copolymer (weight ratio=15/70/15, Mw=28,000) as the alkali-soluble resin (B), 40 parts by weight of dipentaerythritol hexaacrylate as the polyfunctional monomer (C), 10 parts by weight of 2,2'-bis(2,4-dichlorophenyl)-4,4',5,5'-tetraphenyl-1,2'-biimidazole and 10 parts by weight of 4,4'-bis(diethylamino)benzophenone as the photopolymerization initiator (D), and 1,000 parts by weight of ethyl 3-ethoxypropionic acid as a solvent were mixed together to prepare a liquid radiation sensitive composition (composition 2).

[Production of color filter]

A yellow striped color filter was produced on a transparent substrate using the composition (2) in the same manner as in Example 1.

[Evaluation of color filter]

The obtained color filter was evaluated as follows.

Heat Resistance

The heat resistance of the color filter was evaluated in the same manner as in Example 1. As a result, $\Delta Eab$ was 1.56.

Light Resistance

The light resistance of the color filter was evaluated in the same manner as in Example 1. As a result, $\Delta Eab$ was 2.05.

Spectral Transmittance

Figure 4:
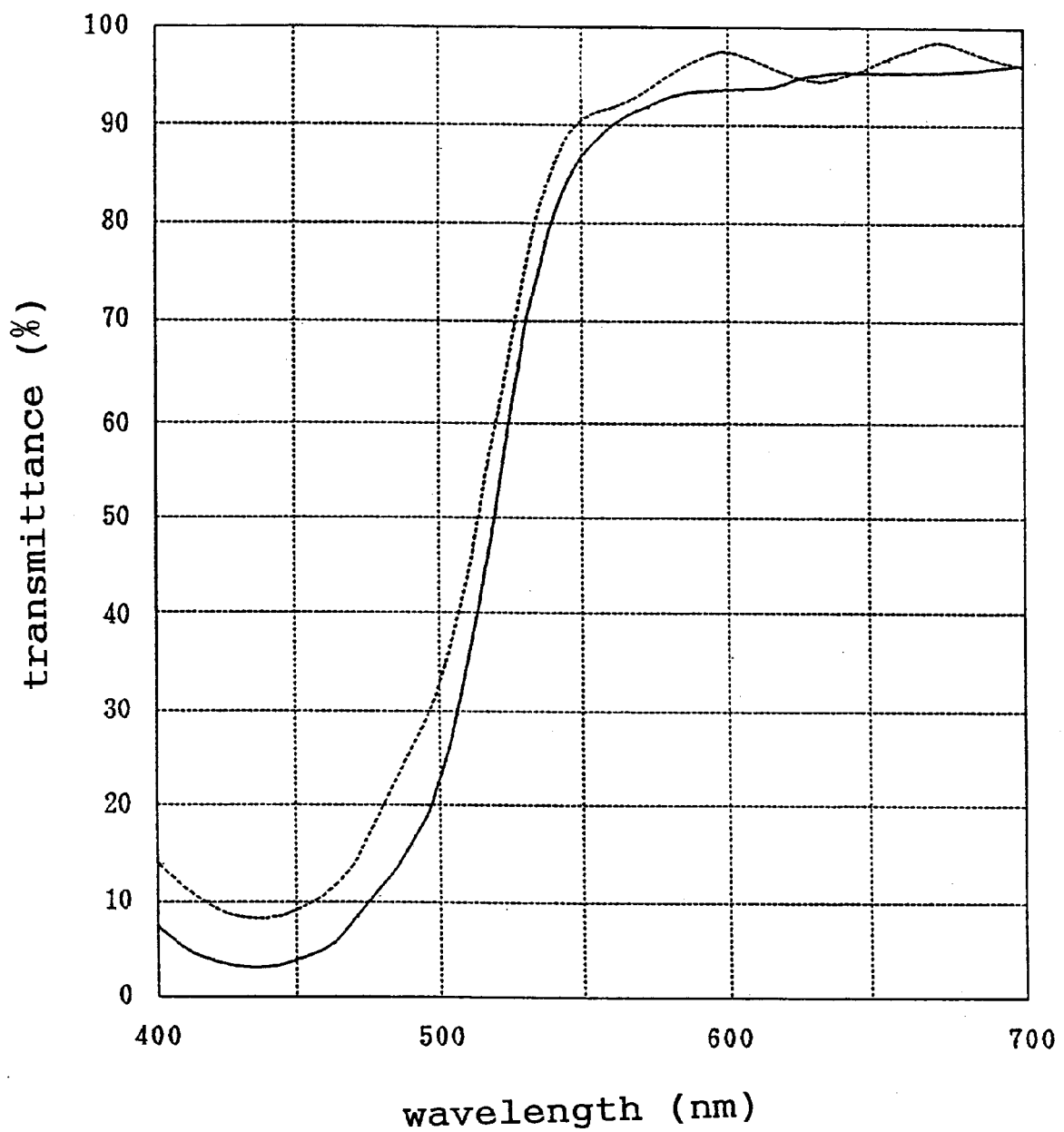
FIG. 4 shows the measurement results of the spectral transmittance of a color filter produced using the radiation sensitive composition of the present invention (composition 2) and a color filter produced using a comparative radiation sensitive composition.

The spectral transmittance of the color filter was measured in the same manner was in Example 1. The measurement result is shown in FIG. 4 (solid line). The spectral transmittance of this color filter is slightly lower than the spectral transmittance (dotted line) of Comparative Example 3, though it is still high.

COMPARATIVE EXAMPLE 3

A liquid radiation sensitive composition was prepared and a color filter was produced and evaluated in the same manner as in Example 1 except that C.I. Pigment Yellow 110 was used alone in place of the mixture of C.I. Pigment Yellow 110 and C.I. Pigment Yellow 83 as the colorant (A).

As a result, this color filter had $\Delta Eab$ of 1.65 for heat resistance and $\Delta Eab$ of 2.15 for light resistance, which were unsatisfactory. The measurement result of the spectral transmittance of this color filter is shown in FIG. 4 (dotted line).

EXAMPLE 3

100 parts by weight of a mixture of C.I. Pigment Blue 15:4 and C.I. Pigment Green 7 in a weight ratio of 60/40 as the colorant (A3), 60 parts by weight of a methacrylic acid/benzyl methacrylate/2-hydroxyethyl methacrylate copolymer (weight ratio=15/70/15, Mw=28,000) as the alkali-soluble resin (B), 40 parts by weight of dipentaerythritol hexaacrylate as the polyfunctional monomer (C), 10 parts by weight of 2,2'-bis(2,4-dichlorophenyl)-4,4',5,5'-tetraphenylbiimidazole and 10 parts by weight of 4,4'-bis (diethylamino)benzophenone as the photopolymerization initiator (D), and 1,000 parts by weight of ethyl 3-ethoxypropionic acid as a solvent were mixed together to prepare a liquid radiation sensitive composition (composition 3).

[Production of color filter]

A cyanic striped color filter was produced on a transparent substrate using the above liquid composition in the same manner as in Example 1.

[Evaluation of color filter]

The obtained color filter was evaluated as follows.

Heat Resistance

The heat resistance of the color filter was evaluated in the same manner as in Example 1. As a result, $\Delta Eab$ was 2.65.

Light Resistance

The light resistance of the color filter was evaluated in the same manner as in Example 1. As a result, $\Delta Eab$ was 2.45.

Spectral Transmittance

Figure 5:
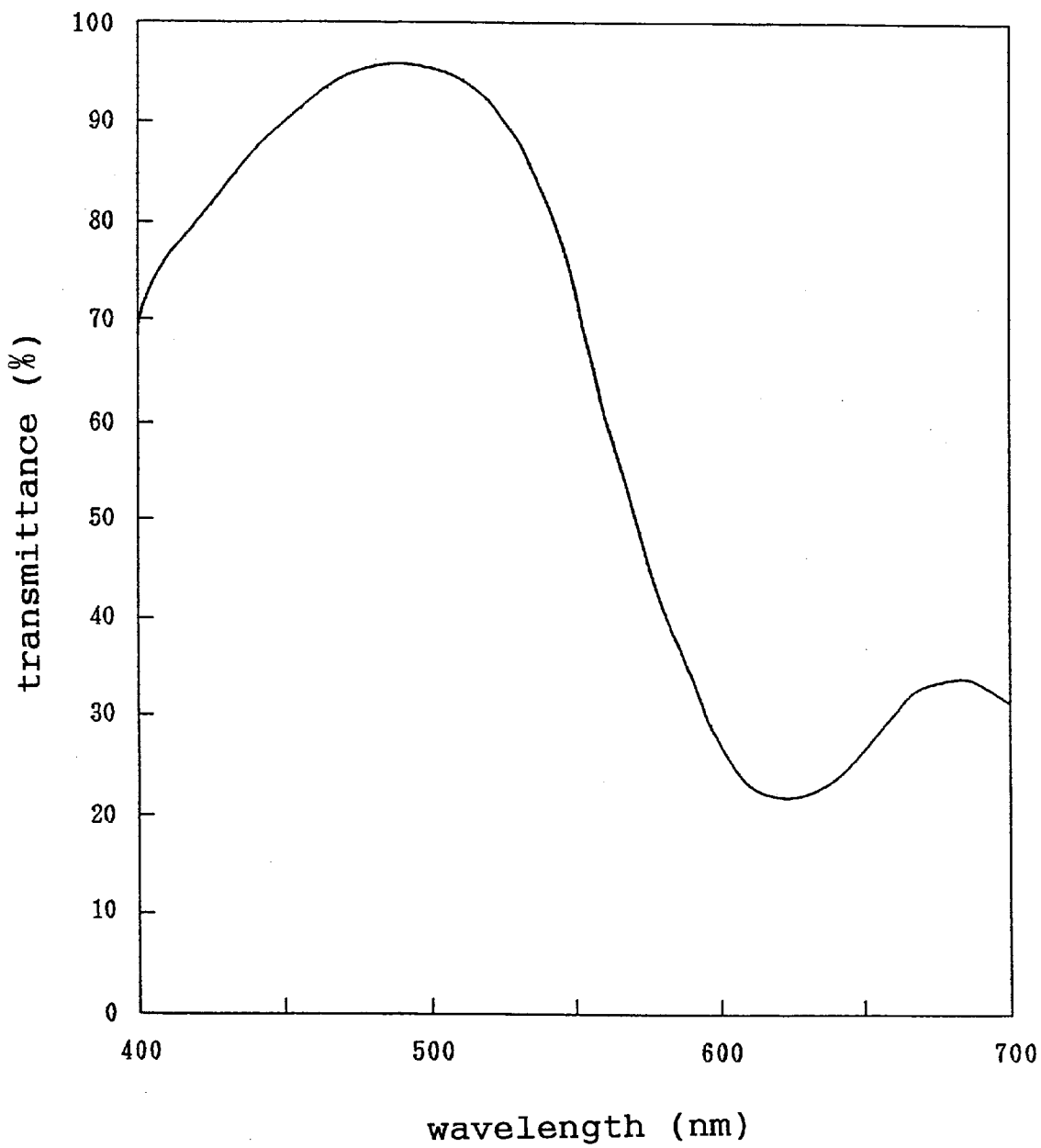
FIG. 5 shows the measurement result of the spectral transmittance of a color filter produced using the radiation sensitive composition of the present invention (composition 3)

The spectral transmittance of the color filter was measured in the same manner as in Example 1. The measurement result is shown in FIG. 5.

EXAMPLE 4

A liquid composition (composition 4) was prepared and a color filter was produced and evaluated in the same manner as in Example 3 except that 100 parts by weight of a mixture of C.I. Pigment Blue 15:4 and C.I. Pigment Green 36 in a weight ratio of 70/30 were used as the colorant (A).

Figure 6:
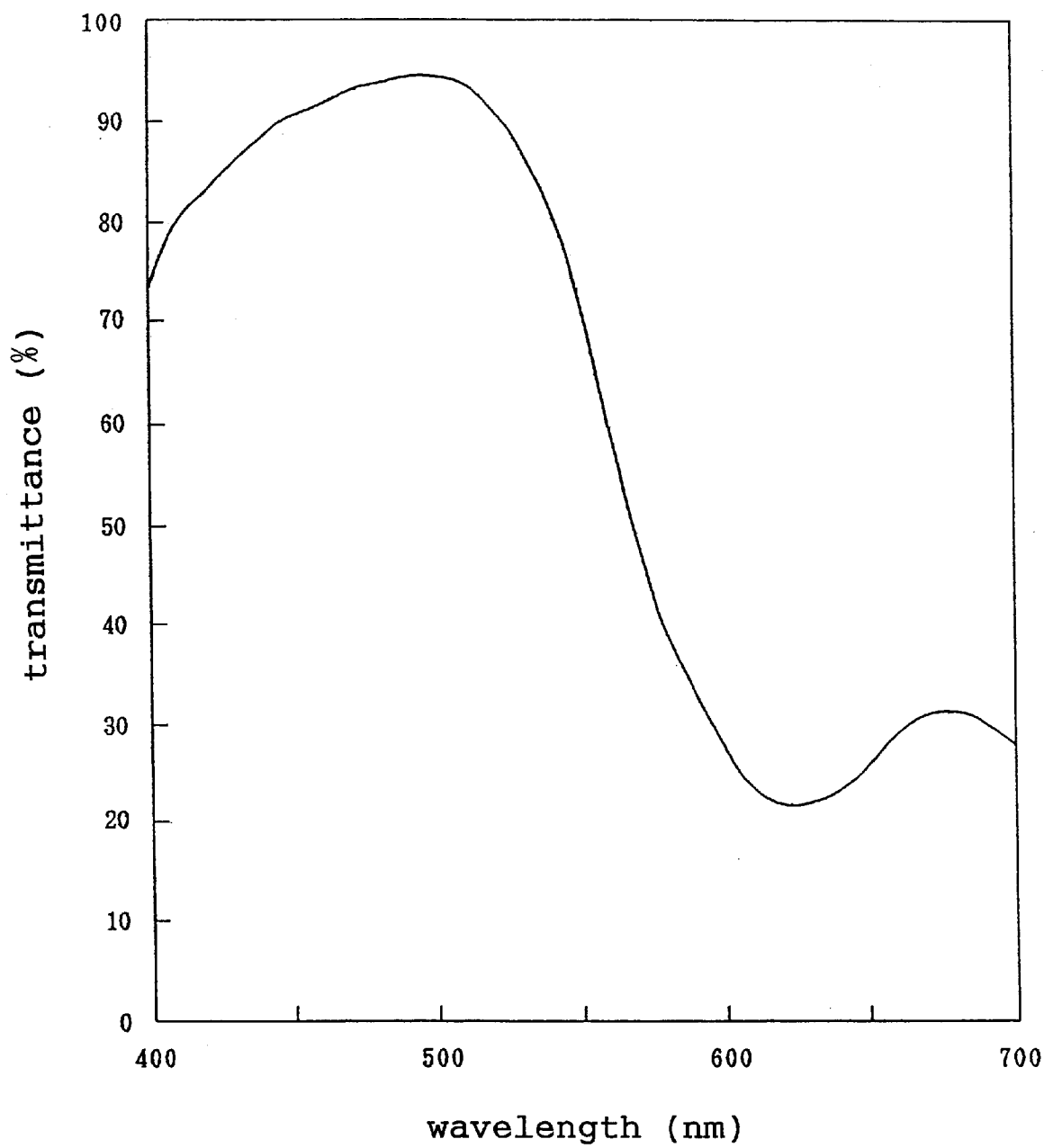
FIG. 6 shows the measurement result of the spectral transmittance of another color filter produced using the radiation sensitive composition of the present invention (composition 4)

As a result, this color filter had $\Delta Eab$ of 2.85 for heat resistance and $\Delta Eab$ of 2.57 for light resistance. The measurement result of the spectral transmittance of this color filter is shown in FIG. 6.

COMPARATIVE EXAMPLE 4

A liquid composition was prepared and a color filter was produced and evaluated in the same manner as in Example 3 except that 100 parts by weight of a mixture of C.I. Pigment Blue 15:4 and C.I. Pigment Yellow 138 in a weight ratio of 85/15 were used as the colorant (A).

Figure 7:
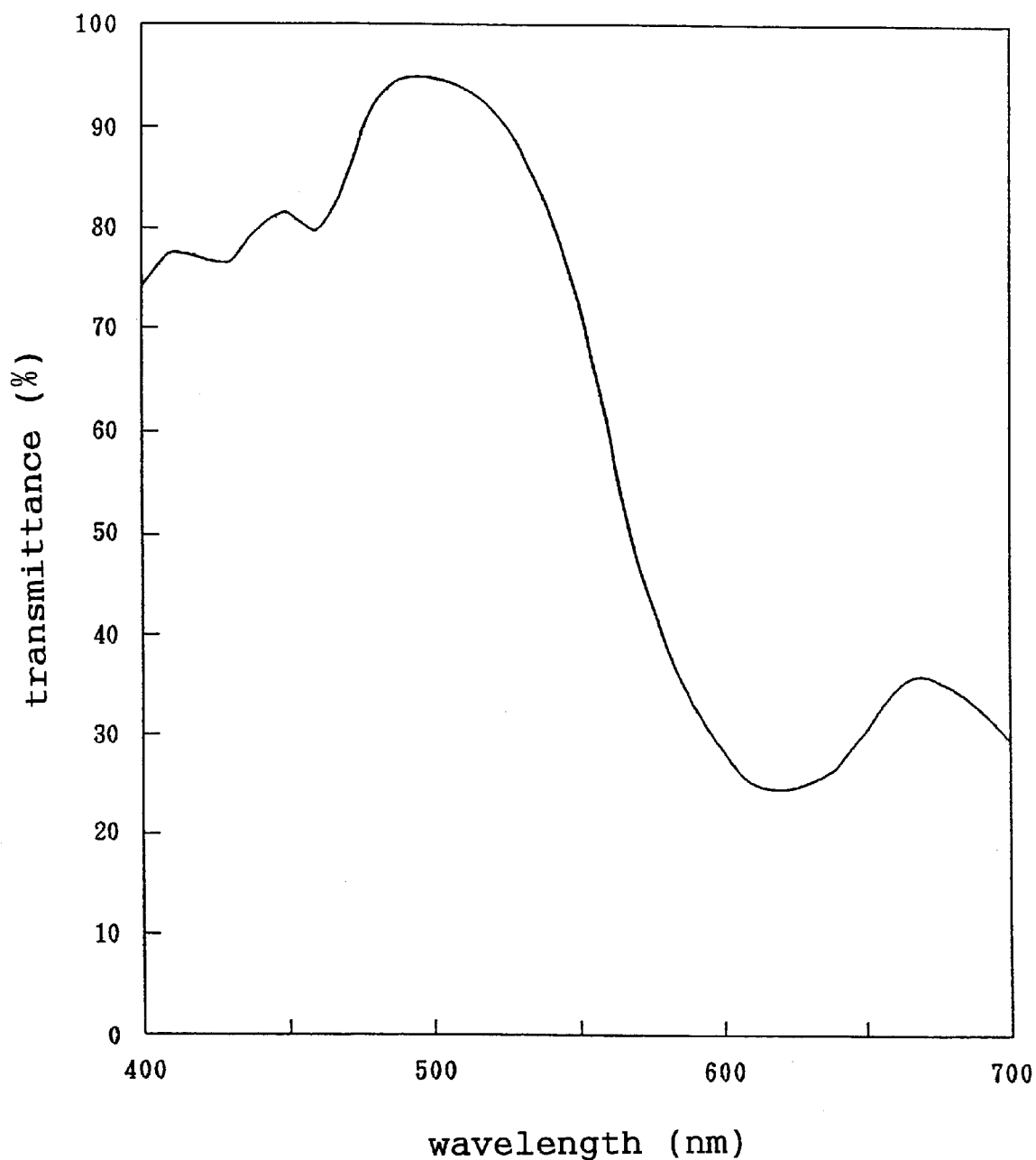
FIG. 7 shows the measurement result of the spectral transmittance of a color filter produced using a comparative radiation sensitive composition (Comparative Example 4)

As a result, this color filter had $\Delta Eab$ of 3.25 for heat resistance and $\Delta Eab$ of 3.07 for light resistance. The measurement result of the spectral transmittance of this color filter is shown in FIG. 7.

EXAMPLE 5

100 parts by weight of C.I. Pigment Red 122 as the organic pigment (A), 60 parts by weight of a methacrylic acid/benzyl methacrylate/2-hydroxyethyl methacrylate copolymer (weight ratio=15/75/15, Mw=28,000) as the alkali-soluble resin (B), 40 parts by weight of dipentaerythritol hexaacrylate as the polyfunctional monomer (C), 10 parts by weight of 2,2'-bis(2-chlorophenyl)-4,4',5,5'-tetraphenylbiimidazole and 10 parts by weight of 4,4'-bis (diethylamino)benzophenone as the photopolymerization initiator (D), and 1,000 parts by weight of ethyl 3-ethoxypropionic acid as a solvent were mixed together to prepare a liquid radiation sensitive composition (composition 5).

REFERENCE EXAMPLE 1

A liquid radiation sensitive composition (Y1) was prepared in the same manner as in Example 1 except that C.I. Pigment Yellow 110/C.I. Pigment Yellow 83 were used in place of C.I. Pigment Red 122.

REFERENCE EXAMPLE 2

A liquid radiation sensitive composition (C1) was prepared in the same manner as in Example 1 except that a cyanogen pigment (C.I. Pigment Blue 15:4/C.I. Pigment green 36) was used in place of C.I. Pigment Red 122.

[Production of color filter]

A color filter was produced by forming red, yellow and cyanic pixel arrays on a transparent substrate using the composition 5, the composition (Y1) and the composition (C1) as follows.

The composition 5 was first applied to the surface of a soda glass substrate having a SiO$_2$ film formed thereon for preventing the dissolution of sodium ions using a spin coater and the resulting substrate was prebaked in a clean oven heated at 80° C. for 10 minutes to form a 0.8-μm-thick coating film.

Thereafter, the substrate was cooled to room temperature and exposed to ultraviolet light having a wavelength of 365 nm, 405 nm and 436 nm with a dosage of 200 mJ/cm$^2$ through a photomask using a high-pressure mercury lamp. This substrate was then immersed in a 0.04-wt % aqueous solution of potassium hydroxide for 1 minute for development, washed with super purified water and dried. Thereafter, the substrate was post-baked in the clean oven heated at 230° C. for 30 minutes to form a pixel array having a 20 μm×20 μm red pixel pattern on the substrate.

Thereafter, the above step of forming the red pixel array was repeated on the substrate having the red pixel array formed thereon using the composition (Y1) and the composition (C1) to form a pixel array having a 20 μm×20 μm yellow pixel pattern and a pixel array having a 20 μm×20 μm cyanic pixel pattern sequentially. Thus, a subtractive color filter having three layers of red, yellow and cyanic pixel arrays was produced.

[Evaluation of color filter]

The obtained color filter was evaluated as follows.

Heat Resistance

The heat resistance of the color filter was evaluated in the same manner as in Example 1. As a result, ΔEab was 1.26.

Light Resistance

The light resistance of the color filter was evaluated in the same manner as in Example 1. As a result, ΔEab was 1.95.

White Balance

Figure 8:
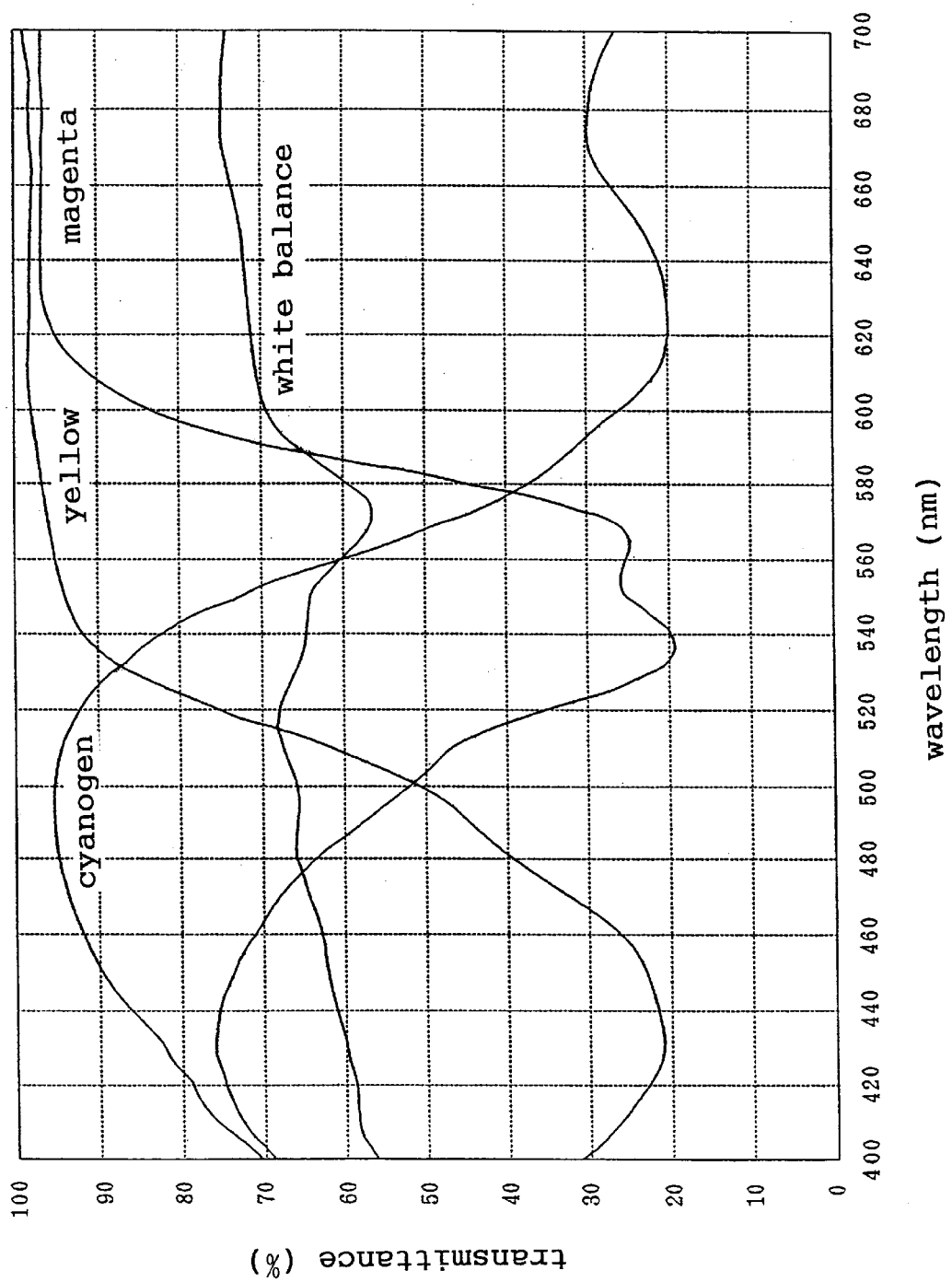
FIG. 8 shows the simulation result of the white balance of a color filter produced using the radiation sensitive composition of the present invention (composition 5)

The above step of forming the red pixel pattern was repeated on the color filter produced in the same manner as described above using the composition (Y1) or the composition (C1) to form a pixel array having a 20 μm×20 μm yellow pixel pattern or a pixel array having a 20 μm×20 μm cyanic pixel pattern. The spectral transmittance of each color filter was measured using a microanalyzer (TC-1800M of Tokyo Denshoku Co., Ltd.) to carry out white balance simulation. The result is shown in FIG. 8.

COMPARATIVE EXAMPLE 5

A liquid radiation sensitive composition having a red pigment dispersed therein was prepared in the same manner as in Example 1 except that C.I. Pigment Red 254 was used in place of C.I. Pigment Red 122 as an organic pigment. This liquid composition is designated as composition (r1).

A color filter was produced using the composition (r1), the composition (Y1) and the composition (C1) and evaluated in the same manner as described above.

Figure 9:
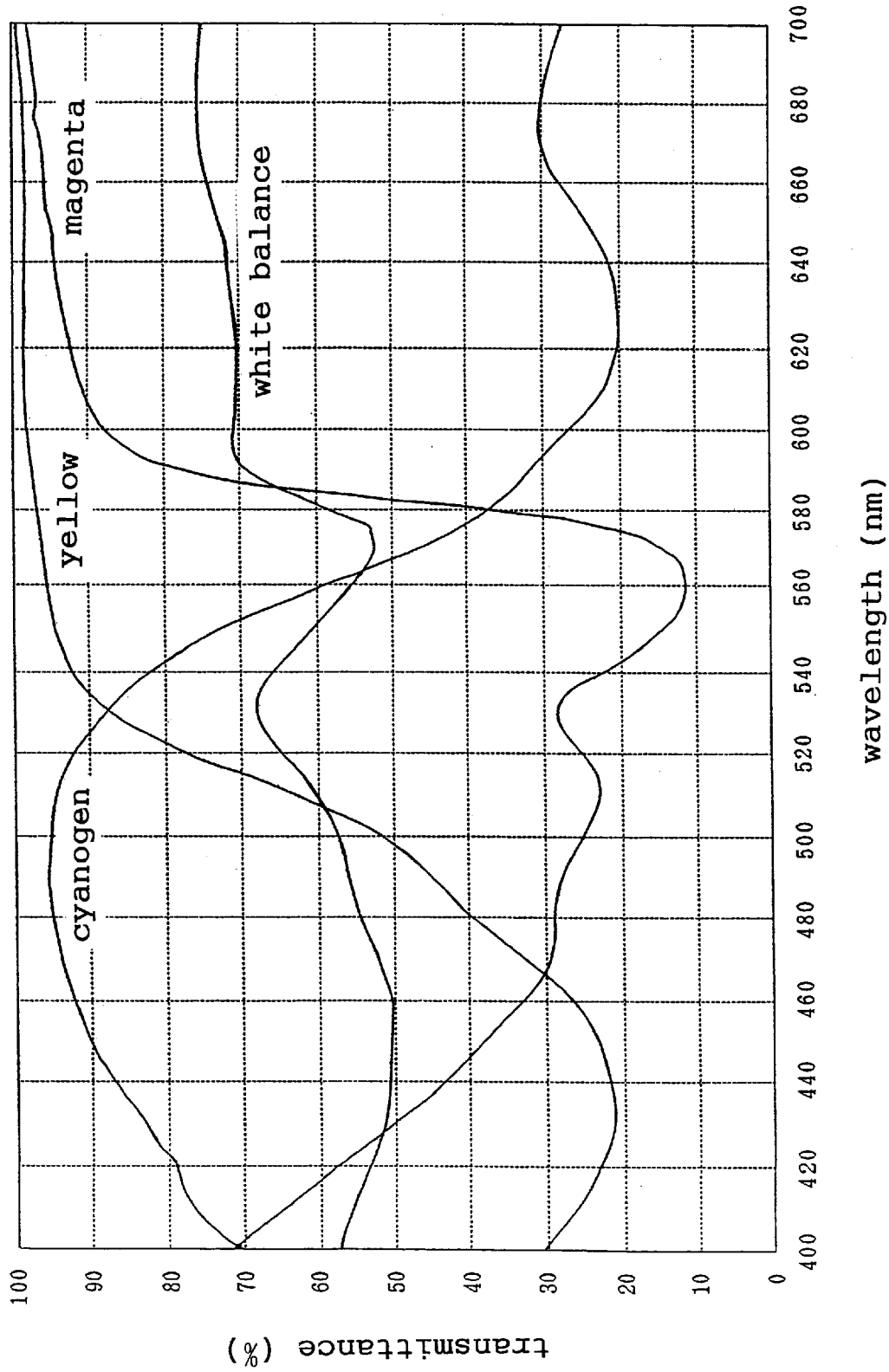
FIG. 9 shows the simulation result of the white balance of a color filter produced using a comparative radiation sensitive composition.

As a result, this color filter had ΔEab of 1.54 for heat resistance and ΔEab of 2.15 for light resistance. The white balance simulation result of this color filter is shown in FIG. 9.

As described above, the radiation sensitive composition of the present invention is excellent in heat resistance and light resistance, has spectral transmittance optimized based on the spectrum of surrounding light or excellent white balance, and can provide an additive or subtractive color filter which is the most suitable for use in a reflection-type color liquid crystal display device.

What is claimed is:

1. A radiation sensitive composition comprising:
   (A1) a colorant containing a quinacridone pigment represented by the following formula (1):

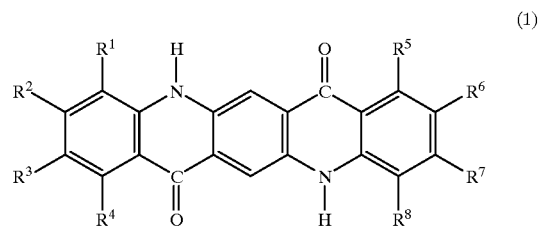

wherein $R^1$ to $R^8$ are independently a hydrogen atom, methyl group or chlorine atom;

(B) an alkali-soluble resin which serves as a binder for the colorant and is soluble in a developer;

(C) a polyfunctional monomer having two or more polymerizable unsaturated bonds;

(D) a photopolymerization initiator; and an orange pigment different from the quinacridone pigment.

2. The radiation sensitive composition of claim 1, wherein the quinacridone pigment represented by the above formula (1) is selected from the group consisting of C.I. Pigment Violet 19 (quinacridone), C.I. Pigment Red 122 (2,9-dimethylquinacridone), C.I. Pigment Red 202 (2,9-dichloroquinacridone), C.I. Pigment Red 206 (solid solution of quinacridone and 6,13-dioxoquinacridone), C.I. Pigment Red 207 (solid solution of quinacridone and 4,11-dichloroquinacridone) and C.I. Pigment Red 209 (3,10-dichloroquinacridone).

3. The radiation sensitive composition of claim 1, wherein the orange pigment is selected from the group consisting of C.I. Pigment Orange 36, C.I. Pigment Orange 64, and C.I. Pigment Orange 71.

4. The radiation sensitive composition of claim 1, wherein the alkali-soluble resin (B) is a copolymer of an ethylenically unsaturated monomer having at least one carboxyl group and a copolymerizable unsaturated monomer having no carboxyl group.

5. The radiation sensitive composition of claim 4, wherein the ethylenically unsaturated monomer having at least one carboxyl group is copolymerized in an amount of 5 to 50 wt %, based on the copolymer.

6. The radiation sensitive composition of claim 1, wherein the alkali-soluble resin (B) has a weight average molecular weight, in terms of polystyrene, of 3,000 to 300,000.

7. The radiation sensitive composition of claim 1, wherein the alkali-soluble resin (B) is contained in an amount of 10 to 1,000 parts by weight, based on 100 parts by weight of the colorant.

8. The radiation sensitive composition of claim 1, wherein the polyfunctional monomer (C) is contained in an amount of 5 to 500 parts by weight, based on 100 parts by weight of the alkali-soluble resin.

9. The radiation sensitive composition of claim 1, wherein the photopolymerization initiator (D) is selected from the group consisting of imidazole compounds, benzoin compounds, acetophenone compounds, benzophenone compounds, α-diketone compounds, polynuclear quinone compounds, xanthone, diazo and triazine compounds.

10. The radiation sensitive composition of claim 1, wherein the photopolymerization initiator (D) is contained in an amount of 0.01 to 200 parts by weight, based on 100 parts by weight of the polyfunctional monomer (C).

* * * * *